United States Patent
Kim et al.

(10) Patent No.: US 8,792,648 B2
(45) Date of Patent: Jul. 29, 2014

(54) APPARATUS AND METHOD FOR TRANSMITTING/RECEIVING VOICE SIGNAL THROUGH HEADSET

(75) Inventors: Hee Young Kim, Seoul (KR); Do Hwan Choi, Seongnam-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 1732 days.

(21) Appl. No.: 11/900,015

(22) Filed: Sep. 6, 2007

(65) Prior Publication Data

US 2008/0175399 A1 Jul. 24, 2008

(30) Foreign Application Priority Data

Jan. 23, 2007 (KR) .............................. 2007-0007072

(51) Int. Cl.
  *H03G 3/20* (2006.01)

(52) U.S. Cl.
  USPC .............................................. 381/57; 381/74

(58) Field of Classification Search
  USPC ..................................... 381/57, 74
  See application file for complete search history.

(56) References Cited

U.S. PATENT DOCUMENTS

| | | | |
|---|---|---|---|
| 6,754,358 B1 | 6/2004 | Boesen et al. | ............... 381/326 |
| 6,823,195 B1 | 11/2004 | Boesen | ..................... 455/522.1 |
| 6,952,483 B2 | 10/2005 | Boesen et al. | ............... 381/326 |
| 7,023,338 B1 * | 4/2006 | Foth | ....................... 340/539.13 |
| 2005/0008167 A1 * | 1/2005 | Gleissner et al. | ............... 381/74 |
| 2008/0201138 A1 * | 8/2008 | Visser et al. | .................. 704/227 |

FOREIGN PATENT DOCUMENTS

| | | | | |
|---|---|---|---|---|
| JP | 08-079868 | 3/1996 | .............. | H04R 1/00 |
| JP | 2003-264883 | 9/2003 | .............. | H04R 1/00 |
| KR | 2002-86433 | 11/2002 | .............. | H04B 1/40 |
| KR | 2003-71040 | 9/2003 | .............. | H04R 1/10 |
| KR | 2004-101373 | 12/2004 | .............. | G10L 11/02 |
| KR | 2005-33309 | 4/2005 | .............. | H04B 1/40 |
| KR | 2006-337939 | 12/2006 | .......... | G10K 11/178 |

* cited by examiner

*Primary Examiner* — Phat X Cao
(74) *Attorney, Agent, or Firm* — Cha & Reiter, LLC

(57) ABSTRACT

An apparatus and method are disclosed, which separates ambient noise from a voice signal in a Bluetooth headset with dual microphones, switches the connection path between the dual microphones and automatically controls output audio gain, based on the ambient noise. The method for outputting the voice signal includes receiving/comparing the first and second input signals from the first and second microphones, extracting the voice signal of substantially identical intensity from the first and second input signals, and transmitting the voice signal from the portable terminal communicating with the Bluetooth headset.

26 Claims, 4 Drawing Sheets

APPARATUS AND METHOD FOR TRANSMITTING/RECEIVING VOICE SIGNAL THROUGH HEADSET

CLAIM OF PRIORITY

This application claims the benefit of the earlier filing date, pursuant to 35 USC 119, to that patent application entitled "APPARATUS AND METHOD FOR TRANSMITTING/RECEIVING VOICE SIGNAL THROUGH HEADSET," filed in the Korean Intellectual Property Office on Jan. 23, 2007 and assigned Serial No. 2007-0007072, the contents of which are incorporated herein by reference.

BACKGROUND OF THE INVENTION

1. Field of the Invention

The present invention relates to a short-range wireless communication systems, and more particularly, to an apparatus and method that can control a transmitted/received voice signal between a Bluetooth headset and a portable terminal using dual microphones of the Bluetooth headset.

2. Description of the Related Art

In general, a Bluetooth network refers to a piconet having one master terminal and a plurality of slave terminals that are connected to each other via the Bluetooth protocol. In one piconet, the plurality of slave terminals may receive data from one master terminal. Multiple piconets may form a Bluetooth network, which is referred to as a scatternet.

With the spread of portable terminals, a user receives data on their portable terminal from another user and transmits the data to another user's portable terminal via the Bluetooth protocol. Also, users can perform telephone communication and listen to music in MP3 format using a wireless Bluetooth headset.

Since the Bluetooth headset provides portability convenience and allows a user to perform a voice call while it performs wireless Bluetooth communications to the portable terminal, the spread of the Bluetooth headset is gradually increasing.

Such a conventional Bluetooth headset performs a voice call as follows. First when a call is initiated, a user talks to a microphone installed on the Bluetooth headset. Then, the Bluetooth headset inputs a voice signal through the microphone and then transmits it to a portable terminal via the Bluetooth communication. The portable terminal transmits the inputted voice signal to a portable terminal of another caller in wireless communication.

However, the conventional Bluetooth headset allows ambient noise along with the voice signal to be input through the microphone, transmitting both to the opposite caller. That is, the noise in the conventional Bluetooth headset decreases the intelligibility of the voice call between the portable terminals.

To solve the problem, a Bluetooth headset has been recently developed, to which a bone conduction microphone is applied. The bone conduction microphone converts vibrations, transmitted through a user's bone, into a voice signal and transmits the voice signal to the Bluetooth headset. The bone conduction microphone can be effective in environments with high levels of ambient noise.

However, the bone conduction microphone has disadvantages in that it attenuates a voice signal in an environment with relatively low ambient noise and decreases the tone and quality of the voice, compared with those of a general microphone that receives a voice signal transmitted through the air. That is, the Bluetooth microphone makes it difficult for an opposite caller to clearly hear the transmitted voice signals due to ambient noise. However, although the conventional bone conduction microphone reduces the ambient noise, it also decreases the tone and quality of a voice in a quiet environment compared with a general microphone.

The conventional Bluetooth headset also has disadvantages in that it makes it difficult for a user performing a voice call to clearly hear the opposite user's voice transmitted through a speaker due to the ambient noise. As a result, the user must manually adjust the volume of the speaker to optimally hear the voice in view of the ambient noise.

SUMMARY OF THE INVENTION

In order to solve the above problems, the present invention provides an apparatus and method for separating a voice signal and ambient noise that are inputted through a Bluetooth headset.

The invention provides an apparatus and method for separating a voice signal and ambient noise, and for outputting only the voice signal in a Bluetooth headset.

The invention provides an apparatus and method for automatically adjusting output audio gain according to ambient noise in a Bluetooth headset.

The invention provides an apparatus and method for adjusting audio gain according to detected ambient noise level and controlling the output volume according to environments in the Bluetooth headset.

The invention provides an apparatus and method for detecting a voice signal of identical intensity from signals inputted through dual microphones of a Bluetooth headset, and for extracting and removing ambient noise whose intensity is different from that of the voice signal, from the input signals.

The invention provides an apparatus and method for controlling the connection paths between dual microphones of a Bluetooth headset, according to ambient noise.

The invention provides an apparatus and method for determining levels of ambient noise in a Bluetooth headset and for switching between a general microphone and a bone conduction microphone, according to the determined level of ambient noise, so that a voice signal can be transmitted through the general microphone in a quiet environment and through the bone conduction microphone in a noisy environment.

In accordance with a first aspect of the present invention, there is provided a method for outputting a voice signal in a headset. The method includes: receiving $1^{st}$ and $2^{nd}$ input signals from $1^{st}$ and $2^{nd}$ microphones, respectively, comparing the $1^{st}$ input signal with the $2^{nd}$ input signal received, extracting a voice signal of identical intensity from the $1^{st}$ and $2^{nd}$ input signals and transmitting the extracted voice signal to a portable terminal that is communicating with the headset.

In accordance with a second aspect of the present invention, there is provided a method for outputting a voice signal in a headset. The method includes: measuring ambient noise from an input signal of a $1^{st}$ microphone; changing a transmission path of the voice signal from the $1^{st}$ microphone to a $2^{nd}$ microphone when the ambient noise is equal to or greater than a certain level, comparing level of the input signal of the $1^{st}$ microphone with that of an input signal of the $2^{nd}$ microphone when the ambient noise is less than the certain level and controlling the transmission path so that it can be directed to a corresponding microphone, in respond to the comparison result.

In accordance with a third aspect of the present invention, there is provided a headset that includes: a $1^{st}$ microphone inputting a user's voice signal and noise signal, a $2^{nd}$ microphone converting a vibration signal generated according to a user's voice event to an electrical signal and outputting it and a controller for separating the voice signal and noise signal from input signals inputted through the $1^{st}$ and $2^{nd}$ microphones, controlling output voice power based on the noise signal, and controlling a transmission path for voice signal between the $1^{st}$ and $2^{nd}$ microphones.

BRIEF DESCRIPTION OF THE DRAWINGS

The above and other features and advantages of the present invention will be more apparent from the following detailed description in conjunction with the accompanying drawings, in which.

DETAILED DESCRIPTION OF THE INVENTION

Figure 1:
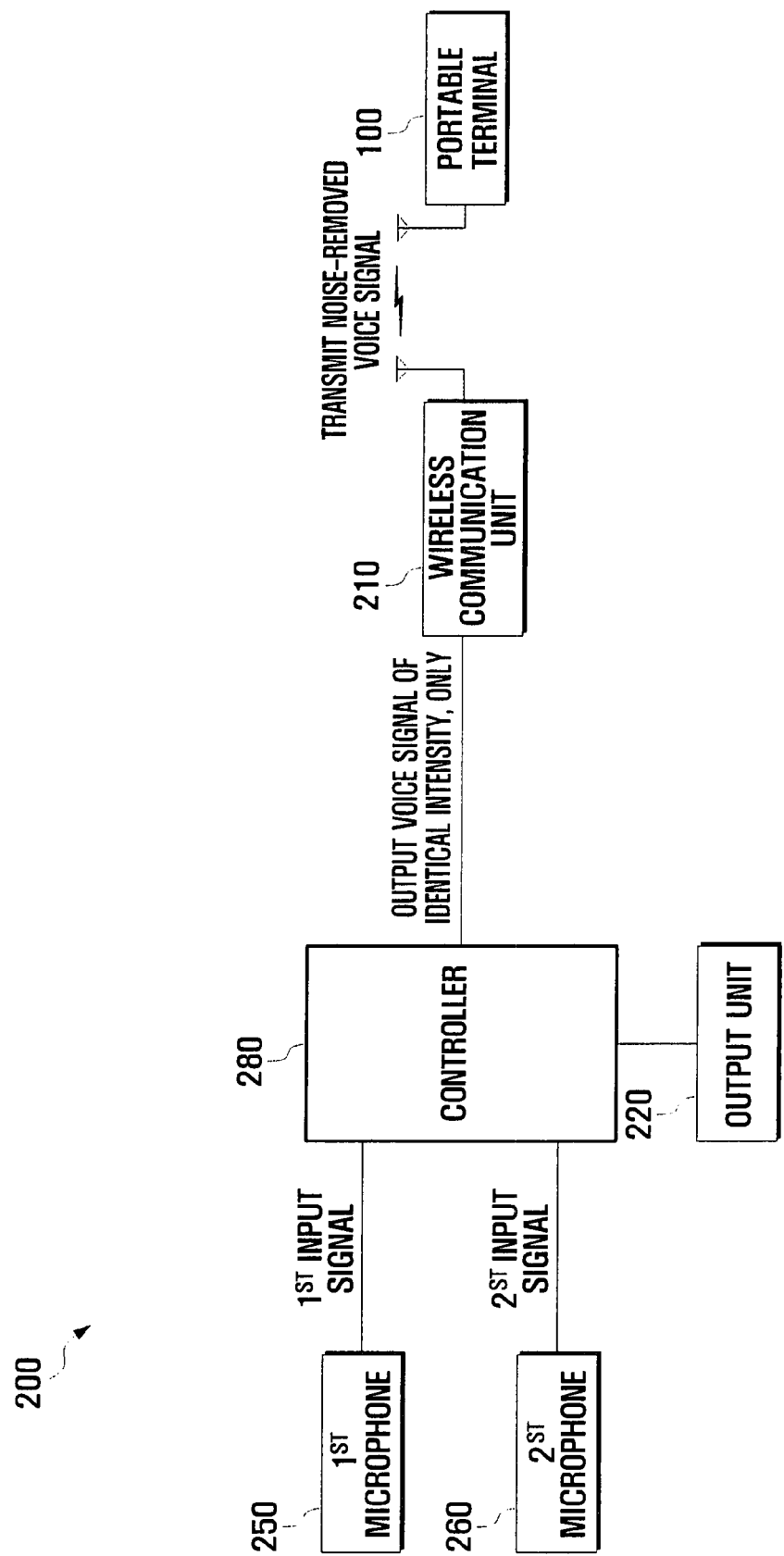
FIG. 1 is a schematic block diagram describing communication between a portable terminal and a Bluetooth headset according to an embodiment of the present invention.

Embodiments of the present invention are described in detail with reference to the accompanying drawings. For the purposes of clarity and simplicity, a detailed description of known functions and configurations incorporated herein will be omitted as it may make the subject matter of the present invention less clear.

The terms or words described in the present description and the claims should not be limited by a general or lexical meaning, but instead should be analyzed as a meaning and a concept through which the inventor defines and describes the present invention at his most effort, to comply with the idea of the present invention. Therefore, one skilled in the art will understand that the embodiments disclosed in the description and configurations illustrated in the drawings are only exemplary embodiments, and that there may be various modifications, alterations, and equivalents thereof to replace the embodiments at the time of filing this application.

The present invention relates to a Bluetooth headset and a transmitting/receiving signal to/from a portable terminal via the Bluetooth protocol. Specially, the Bluetooth headset according to an embodiment of the present invention can separate a voice signal from ambient noise so that a more intelligible calling voice can be transmitted.

The Bluetooth headset according to an embodiment of the present invention can automatically adjust output audio gain based on ambient noise separated from an audio signal (for example, a voice signal, a music signal, etc.) received from a portable terminal when outputting the audio signal, thereby providing the received audio signal with better volume.

The Bluetooth headset according to an embodiment of the present invention is also configured to include dual microphones whose connection paths are adaptively controlled according to measured ambient noise. That is, the Bluetooth headset transmits a voice signal through a general microphone in a quiet environment with relatively low ambient noise and through a bone conduction microphone in a noise environment with relatively high ambient noise. Therefore, the Bluetooth headset can automatically transmit the voice signal through the general microphone or the bone conduction microphone depending on the amount of ambient noise in an environment.

The Bluetooth headset according to the present invention may be connected via a wire to a portable terminal. The present invention will also be described based on the Bluetooth headset, in which the Bluetooth headset performs Bluetooth communications with a portable terminal. However, it will be easily recognized by those skilled in the art that the principles of the present invention can be used in other short-range wireless communications, such as an infrared short-range wireless communication, and communication using Zigbee technology, etc., and in other various wireless communications where signals can be transmitted/received through communication channels at a short range.

Although the present invention is described based on a headset as an embodiment thereof, it can be modified in such a way that the headset is replaced with various devices having dual microphones, such as an ear phone, stereo-headset, headphone, and portable terminal, etc.

FIG. 1 is a schematic block diagram describing communication between a portable terminal and a Bluetooth headset according to an embodiment of the present invention.

As shown in FIG. 1, a portable terminal 100 is connected to a Bluetooth headset 200 via the Bluetooth protocol and transmits data, such as a control signal and a voice signal, etc., to the Bluetooth headset 200. The portable terminal 100 receives data, such as a control signal and a voice signal, from the Bluetooth headset 200. The portable terminal 100 serves as a master terminal in a piconet, e.g., a Bluetooth network.

The Bluetooth headset 200 receives the data from the portable terminal 100 and outputs it through an output unit 220. The output unit 220 may include an amplifier, a speaker, and a receiver, etc. The Bluetooth headset 200 separates a user's voice signal from ambient noise, and transmits only the user's voice signal to the portable terminal 100 via Bluetooth communication. The Bluetooth headset 200 controls the audio gain applied to the amplifier according to the levels of the separated ambient noise to automatically adjust the volume of the output unit 220. The Bluetooth headset 200 adaptively switches a transmission path of the voice signal between its dual microphones according to a determined ambient noise.

To this end, the Bluetooth headset 200 includes a first microphone 250, a second microphone 260, an output unit 220, a controller 280, and a wireless communication unit 210. Also, the Bluetooth headset 200 may further include elements, which will be described in FIG. 2 and such configuration will be described in detail with reference to FIG. 2. The Bluetooth headset 200 serves as a slave terminal in the illustrated piconet.

The following is a description of voice signal transmission/reception between the Bluetooth headset 200 and the portable terminal 100 with reference to FIG. 1.

A user's voice event occurs at the first microphone 250 and second microphone 260. Here, the first and second microphones 250 and 260 may be implemented by a general microphone and a bone conduction microphone, respectively. According to settings, only one of the first and second microphones 250 and 260 may be operated. The voice event is converted into a voice signal by the first microphone 250 and into a vibration signal by the second microphone 260.

That is, the first and second microphones 250 and 260 convert the voice event into a first input signal (the voice signal) and a second input signal (the vibration signal), respectively, and then transmits them to the controller 280. Here, the first and second microphones 250 and 260 may amplify the first and second input signals at a certain ratio and then input them to the controller 280. To this end, the first and second microphones 250 and 260 may be configured to include amplifying units, respectively. Instead of including the amplifying units in the first and second microphones, they may be additionally installed to amplify the first and second input signals of the first and second microphones and to input them to the controller 280.

Next, the controller 280 compares the first input signal with the second input signal and extracts a voice signal of identical intensity from the first ʳ and second input signals. For example, based on digital signal processing (DSP), the first and second input signals are compared to extract the voice signal that has similar patterns of frequency, amplitude, and phase within a range of error. Here, the voice signal may be extracted by comparing only one of the frequency, amplitude, and phase patterns between the first and second input signals. After that, the controller 280 extracts signals (for example, ambient noise inputted through the first microphone) whose intensity is different from that of the extracted voice signal, thereby separating the signals (ambient noise) from the voice signal. Then, the controller 280 transmits only the voice signal to the wireless communication unit 210. The wireless communication unit 210 transmits the inputted voice signal to the portable terminal 100 via the Bluetooth communication.

The controller 280 judges a level of the extracted ambient noise based on a mapping table where audio gain information has been set based on levels of ambient noise. The controller 280 adjusts audio gain of the output unit 220 based on the audio gain corresponding to the level of the ambient noise. Therefore, volume corresponding to the voice signal received from the portable terminal 100 can be automatically adjusted and outputted according to the level of the ambient noise.

Meanwhile, although the foregoing described the embodiment where the first and second microphones 250 and 260 are simultaneously used, the embodiment of the present invention supports a dual microphone mode and a single microphone mode. Also will be described further, the embodiment of the present invention is implemented in such a way that the first microphone 250 or the second microphone 260 is selectively used according to the measured level of ambient noise. That is, the embodiment controls the connection of a transmission path of a voice signal to one of the microphones according to the level of ambient noise. For example, the embodiment of the present invention switches between the first and second microphones 250 and 260 in such a way that the voice signal can be transmitted through the first microphone 250, for example, a general microphone, when the level of ambient noise is low (i.e., in a quiet environment) and transmitted through the second microphone 260, for example, a bone conduction microphone, when the level of ambient noise is high (i.e., in a noisy environment).

Figure 2:
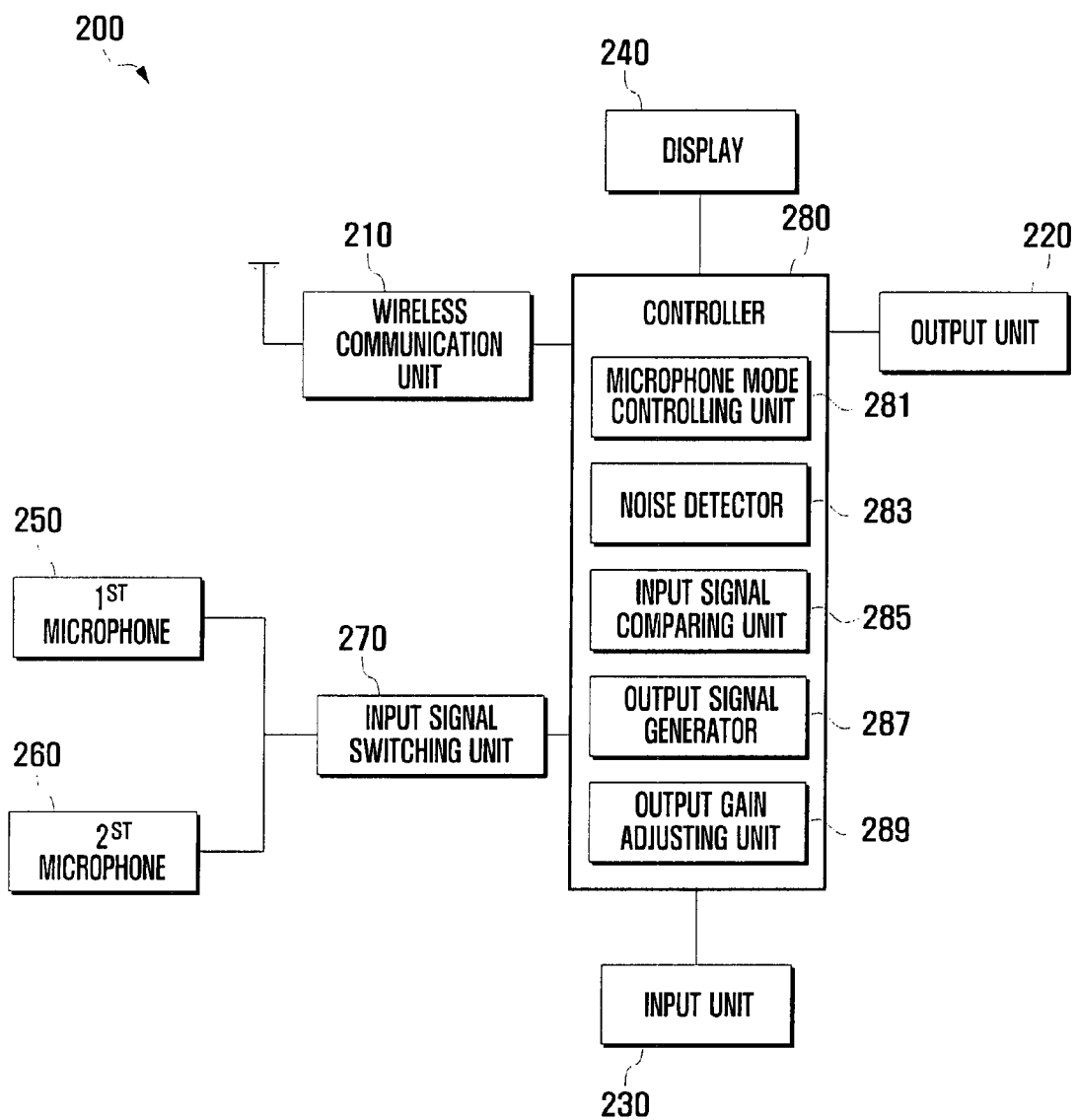
FIG. 2 is a schematic block diagram illustrating a Bluetooth headset according to an embodiment of the present invention.

FIG. 2 is a schematic block diagram illustrating a Bluetooth headset according to an embodiment of the present invention.

As shown in FIG. 2, the Bluetooth headset 200 includes a wireless communication unit 210, an output unit 220, an input unit 230, a display 240, a $1^{st}$ microphone 250, a second microphone 260, a switching unit 270, and a controller 280. The controller 280 includes a microphone mode controlling unit 281, a noise detecting unit 283, an input signal comparing unit 285, an output signal generating unit 287, and an output gain adjusting unit 289.

The wireless communication unit 210 performs Bluetooth communications with other Bluetooth devices through an antenna (for example, a Bluetooth antenna, etc.), based on a Bluetooth protocol. The wireless communication unit 210 stores a host stack administrating Bluetooth communications, Bluetooth profiles and application programs which can be selected according to functions or conditions of external Bluetooth devices as communication targets. To this end, the wireless communication unit 210 may further include a storage unit.

The Bluetooth profile includes hands-free (HF) profile for supporting a hands-free set, headset (HS) profile for supporting a headset, and cordless telephone profile (CTP) for supporting a wireless telephone, which are selectively adopted according to external Bluetooth devices, for example. Specifically, the wireless communication unit 210 receives a wireless voice signal from the portable terminal 100 and converts it into a short-range wireless communication conversion format to transmit the converted result to the output unit 220. As well, the wireless communication unit 210 coverts the voice signal transmitted from the first microphone 250 and/or the second microphone 260 into the short-range wireless communication conversion format to transmit it to the portable terminal 100.

The wireless communication unit 210 may include a transmission/reception unit (not shown), a data converting unit (not shown), and an amplifying unit (not shown). The transmission/reception unit serves to transmit/receive a wireless signal through an antenna. The data converting unit converts an inputted analog signal into a digital signal, or converts the digital signal into an analog signal. The data converting unit is configured in such a way that a signal to be transmitted is modulated or a received signal is demodulated. The amplifying unit amplifies the inputted/outputted signals at a certain ratio. That is, the amplifying unit amplifies a received weak signal to have a certain level of voltage or amplifies power of the wireless signal to be transmitted through the air.

The output unit 220 serves to convert a voice signal, which is received from the portable terminal 100 through the wireless communication unit 210 under the control of the controller 280, into an audible sound to output it. The output unit 220 includes an amplifier for amplifying an inputted voice signal to have a certain level of signal, and a speaker/receiver for outputting the amplified voice signal, i.e., an audible sound. The output unit 220 may include a bone conduction speaker that outputs an opposite caller's voice clearly in a very noisy environment.

The input unit 230 includes a button group for operating the Bluetooth headset 200. The button group includes a main button performing a call and power on/off, and a volume button for adjusting volume of the Bluetooth headset 200. The input unit 230 transmits a control signal inputted by the button group to the controller 280. The input unit 230 may be implemented with a touch pad, a general type of button, or combination thereof, according to the type of headset 200.

The display 240 is implemented with a light emitting diode (LED) for indicating a state of the Bluetooth headset 200, in which the state is variously displayed under the control of the controller 280.

The first microphone 250 serves to a general microphone function of the Bluetooth headset 200. Specifically, the first microphone 250 inputs a user's voice and ambient noise. The first microphone 250 may further include a sensor (not shown) for measuring ambient noise at its input portion.

The second microphone 260 converts a vibration signal generated by the user's input event (for example, user's pronunciation, etc.) into an electrical signal to transmit it to the controller 280. The second microphone 260 does not input the user's voice but inputs the vibration signal of the user's skull. That it, the second microphone 260 does not input an external sound (for example, ambient noise). Therefore, the second microphone 260 enables the headset to precisely transmit the signal without distortion even in a very noisy environment. To this end, the second microphone 260 as a bone conduction microphone may include a bone conduction sensor (not shown) that detects vibrations caused by a user's voice to convert them into a voice signal.

The switching unit 270 serves as a switch for switching the connection path between the first and second microphones 250 and 260 under the control of the controller 280. For example, when a mode is set to use only one of the first and second microphones 250 and 260, which is called a single microphone mode, the switching unit 270 performs a switching operation so that a connection path can be formed to the first microphone 250 or the second microphone 260 in response to the single microphone mode. As well, when a dual microphone mode is set, the switching unit 270 is operated in such a way to connect a connection path to both the first microphone 250 and the second microphone 260. Also, the switching unit 270 adaptively switches a connection path between the first microphone 250 and the second microphone 260 according to a control signal of the controller 280.

The controller 280 controls on/off operations of the Bluetooth headset 200 according to a control signal received from the input unit 230. The controller 280 transmits the voice signal received through the wireless communication unit 210 to the output unit 220. Also, the controller 280 transmits the voice signal, transmitted from the first microphone 250 or the second microphone 260, through the wireless communication unit 210. Specifically, the controller 280 compares the input signals of the first and second microphones 250 and 260, respectively, to extract a voice signal of identical intensity. The controller 280 separates ambient noise whose intensity is different from that of the voice signal when extracting the voice signal from the input signals, and control output audio gain according to the ambient noise. The controller 280 controls a connection path between the first and second microphones 250 and 260, respectively.

The following is a detailed description of operations of the controller 280.

The controller 280 compares the first input signal, which is mixed with ambient noise and inputted through the first microphone 250, with the second input signal inputted through the second microphone 260, and then extracts a voice signal with identical intensity from the first and second input signals from the comparing result. For example, based on digital signal processing, the first and second input signals are compared to extract the voice signal that has similar patterns of frequency, amplitude, and phase within a range of error. Here, the voice signal may be extracted by comparing only one of the frequency, amplitude, and phase patterns, or by comparing all of the patterns.

After that, the controller 280 detects signals whose intensity is different from that of the extracted voice signal, and then determines that the detected signals are ambient noise. After separating the ambient noise and the extracted voice signal, the controller 280 transmits only the voice signal to the wireless communication unit 210, such that only the voice signal can be transmitted to the portable terminal 100.

As well, the controller 280 controls the volume of the output unit 220 using the detected ambient noise. Specifically, the controller 280 determines audio gain corresponding to the level of the ambient noise based on a mapping table where audio gains have been set based on levels of ambient noise. After that, the controller 280 controls the output volume of the output unit 220 based on the determined audio gain. Therefore, the controller 280 can adaptively control optimum volume of audio signals (for example, voice signal, music signal, etc.) transmitted from the portable terminal 100 according to the environments.

Also, the controller 280 periodically measures ambient noise through the first microphone 250 in the single microphone mode. For example, the controller 280 measures ambient noise inputted to the first microphone 250 at the time point when the Bluetooth headset 200 initiates a call through the portable terminal 100. Then, the controller 280 compares the measured ambient noise with a critical value previously set, and then changes a connection path from the $1^{st}$ microphone 250 to the second microphone 260 when the ambient noise is greater than the critical value. In that case, it is preferable that the controller 280 changes the single microphone mode to the dual microphone mode.

Also, the controller 280 periodically measures receive sensitivities (for example, voice signal level) of the first and second microphones 250 and 260 in the dual microphone mode. When the receive sensitivity of the first microphone 250 is equal to or greater than that of the second microphone 260, the controller 280 changes the connection path from the $2^{nd}$ microphone 260 to the first microphone 250.

To efficiently control such operations, the controller 280 may further include a microphone mode controlling unit 281, a noise detector 283, an input signal comparing unit 285, an output signal generating unit 287, and an output gain adjusting unit 289.

The microphone mode controlling unit 281 controls microphone use modes according to user's settings. That is, when the dual microphone mode where the $1^{st}$ and $2^{nd}$ microphones 250 and 260 are operated is set, the microphone mode controlling unit 281 controls such that the switching unit 270 is connected to the first and second microphones 250 and 260. On the other hand, when the single microphone mode where one of the first and second microphones 250 and 260 is operated is set, the microphone mode controlling unit 281 controls such that the switching unit 270 is connected to one of the first and second microphones 250 and 260.

That is, the microphone mode controlling unit 281 controls connection paths between the $1^{st}$ and $2^{nd}$ microphones 250 and 260 based on the control of the controller 280. Specifically, the microphone mode controlling unit 281 controls the connection path between the first and second microphones 250 and 260 to use a proper microphone in the current environment, according to a control signal that the controller 280 generates based on ambient noise levels and/or receive sensitivities of the first and second microphones 250 and 260.

The noise detector 283 periodically detects ambient noise through the first microphone 250. That is, the detector 283 periodically detects the ambient noise in signals inputted through the first microphone 250. The detector 283 receives an ambient noise value, measured by a sensor that detects noise of the first microphone 250, to detect ambient noise levels.

The input signal comparing unit 285 inputs the detected ambient noise from the noise detector 283, and determines whether the ambient noise level is greater than a certain level. That is, the input signal comparing unit 285 compares the ambient noise level with a critical level previously set to determine as to whether the ambient noise level is greater than the critical level. When the determination is positive, the microphone mode controlling unit 281 controls the connection path between the first and second microphones 250 and 260.

The input signal comparing unit 285 compares the first input signal and the second input signal under the control of the controller 280. The first input signal refers to signals where a user's voice signal is mixed with ambient noise, and the second input signal includes a voice signal converted from a vibration signal. The input signal comparing unit 285 compares the first input signal with the second input signal that is not mixed with the ambient noise. The input signal comparing unit 285 compares the first input signal with the second input signal based on digital signal processing. Specifically, the input signal comparing unit 285 compares similar patterns of frequency, amplitude, and phase of the first and second input signals within a range of error. Here, according to the settings, the input signal comparing unit 285 compares only one of the frequency, amplitude, and phase patterns, or all of the patterns.

The input signal comparing unit 285 compares receive sensitivity (for example, level of the first input signal) of the first microphone 250 with that of the second microphone 260 (for example, level of the second input signal). Here, according to differences in the levels of the first and second input signals, the microphone mode controlling unit 281 changes connection paths between the first and second microphones 250 and 260, which will be described with reference to FIGS. 3 and 4.

The output signal generating unit 287 detects a voice signal of identical intensity in the first and second input signals based on the comparison information. The output signal generating unit 287 detects a signal (for example, ambient noise mixed with the first input signal) whose intensity is different from that of the detected voice signal, in which the detected signal is called ambient noise. The output signal generating unit 287 separates the detected voice signal and the ambient noise. The output signal generating unit 287 employs digital signal processing technology. The output signal generating unit 287 detects the voice signal of identical intensity based on comparison information of the input signal comparing unit 285. That is, the output signal generating unit 287 detects a signal of similar patterns of frequency, amplitude, and phase in the first and second input signals, and determines that the signal of identical signal is a voice signal. Then, the controller 280 amplifies the detected voice signal at a certain ratio and transmits it to the portable terminal 100.

The output gain adjusting unit 289 adjusts audio gain of the output unit 220 using the detected ambient noise. The output gain adjusting unit 289 determines the audio gain according to the detected level of the ambient noise based on a mapping table where audio gains have been set based on ambient noise levels. After that, the output gain adjusting unit 289 controls an amplifier of the output unit 220 based on the determined audio gain, thereby optimally adjusting volume of the output unit 220 in response to the ambient noise.

The foregoing has described a configuration of the Bluetooth headset 200 according to an embodiment of the present invention. Here, it is will be recognized by those skilled in the art that the present invention is not limited by the described embodiments. For example, the Bluetooth headset 200 may be modified to further include a memory that stores data transmitted from the portable terminal 100, Bluetooth address BT_ADDR and pincode PIN_CODE of the Bluetooth headset 200, an audio unit that converts an analog audio signal, inputted through the first and second microphones 250 and 260, respectively, into a digital audio signal and reproduces an analog audio signal, converted from a digital audio signal outputted from the controller 280, through the output unit 220; and an interface unit for supporting wire connection between the Bluetooth headset 200 and the portable terminal 100.

Also, the foregoing has described operations of the Bluetooth headset 200 according to an embodiment of the present invention. The following is a description of a method for removing ambient noise inputted through the microphone of the Bluetooth headset and transmitting a voice signal, a method for controlling output gain according to ambient noise, and a method for setting connection paths between dual microphones according to ambient noise. Meanwhile, it will be appreciated to those skilled in the art that the following embodiments do not limit the present invention but are changed or modified to be various other embodiments.

Figure 3:
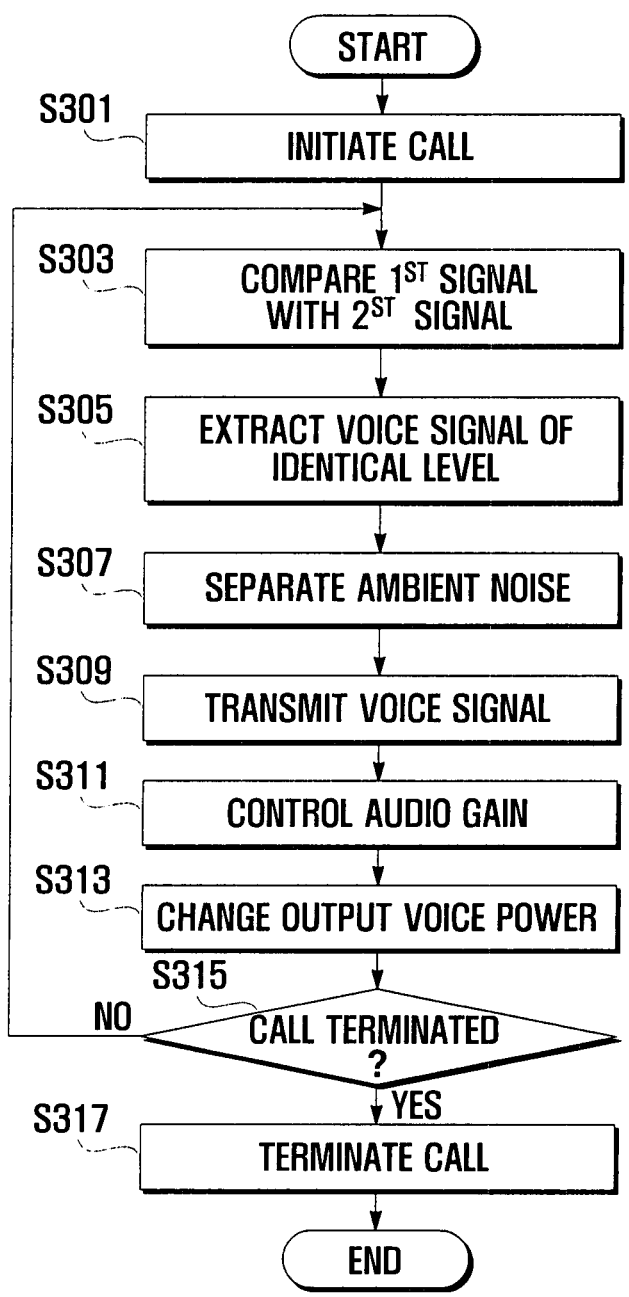
FIG. 3 is a flow chart describing a method for outputting a voice signal from a Bluetooth headset according to an embodiment of the present invention.

FIG. 3 is a flow chart describing a method for removing ambient noise and adjusting audio gain in a Bluetooth headset according to an embodiment of the present invention. Specifically, FIG. 3 is to describe a case where the Bluetooth headset is set in a dual microphone mode.

As shown in FIG. 3, when a call is initiated (S301), the controller compares an input signal of the first microphone (first input signal) with an input signal of the second microphone (second input signal) (S303). Here, the first input signal refers to a signal where a user's voice signal is mixed with ambient noise, inputted through the first microphone. Also, the second input signal is a voice signal converted from a vibration signal, inputted through the second microphone.

Next, the controller detects a signal of identical intensity in the first and second input signals based on the comparison result and determines that the detected signal is the voice signal (S305). After that, the controller detects a signal whose intensity is different from that of the voice signal, which is referred to as an ambient noise signal, and separates the ambient noise signal from the voice signal (S307).

Such detection and separation are performed based on digital signal processing. For example, the controller compares frequency, amplitude, and phase, etc. of the first and second input signals to extract a signal that has a similar pattern from the first and second input signals within a range of error. Here, the controller can compares one of the patterns according to the settings or can compare all of the patterns. The controller determines that the signal of identical intensity is the voice signal when the similar pattern is detected with the error, based on the comparison. Also, the controller detects a signal whose intensity is different from that of the voice signal and determines that the detected signal is ambient noise.

Here, the signal of identical intensity in the first and second input signals becomes the voice signal that does not include ambient noise. Such voice signal is transmitted to the portable terminal in the processing of a voice call (S309).

After that, the controller adjusts output audio gain according to the detected ambient noise (S311). Specifically, the controller extracts audio gain corresponding to the detected ambient noise from a mapping table where audio gains have been set based on ambient noise levels, and adjusts output audio gain of the output unit according to the extracted audio gain. Next, the controller adjusts output volume of the output unit according to the audio gain (S313).

Meanwhile, it will be appreciated that the above steps S303 to S313 are not only subjected to the sequence as described above but may be performed in other sequences. For example, the detection of the voice signal and the ambient noise and the adjustment of the output audio gain are adaptively operated in the Bluetooth headset. These performing sequences do not limit the present invention.

Next, the controller determines whether the call is terminated (S315). When the determination of S315 is positive, the call is terminated (S317). It is preferable that the controller terminates the comparison, the voice signal extraction, and the audio gain control in the call termination.

Here, the first input signal of the first microphone includes a user's voice and ambient noise, and the second input signal of the second microphone does not include ambient noise or may include and input a very little amount of ambient noise.

The controller compares the first and second input signals and extracts a signal from the first input signal, in which the extracted signal has intensity identical to that of the second input signal. After that, the controller determines that the extracted signal is the voice signal and separates the voice signal from the ambient noise to output only the voice signal. That is, the controller can transmit only the voice signal, which does not include the ambient noise, to the portable terminal. Therefore, the portable terminal receives the voice signal via Bluetooth communication and then transmits it to the opposite portable terminal via wireless communication. Thus, a portable terminal user's voice can be clear during a call.

Also, the controller adjusts audio gain of the output unit based on the ambient noise. The controller determines a level of ambient noise and extracts audio gain according to the determined ambient noise level from the mapping table where audio gains have been set. After that, the controller adjusts volume of the output unit based on the extracted audio gain. Accordingly, the Bluetooth headset of the present invention automatically adjusts audio gain of the output unit (for example, a receiver or speaker) according to ambient noise, thereby maintaining the highest calling voice quality in any environment.

Figure 4:
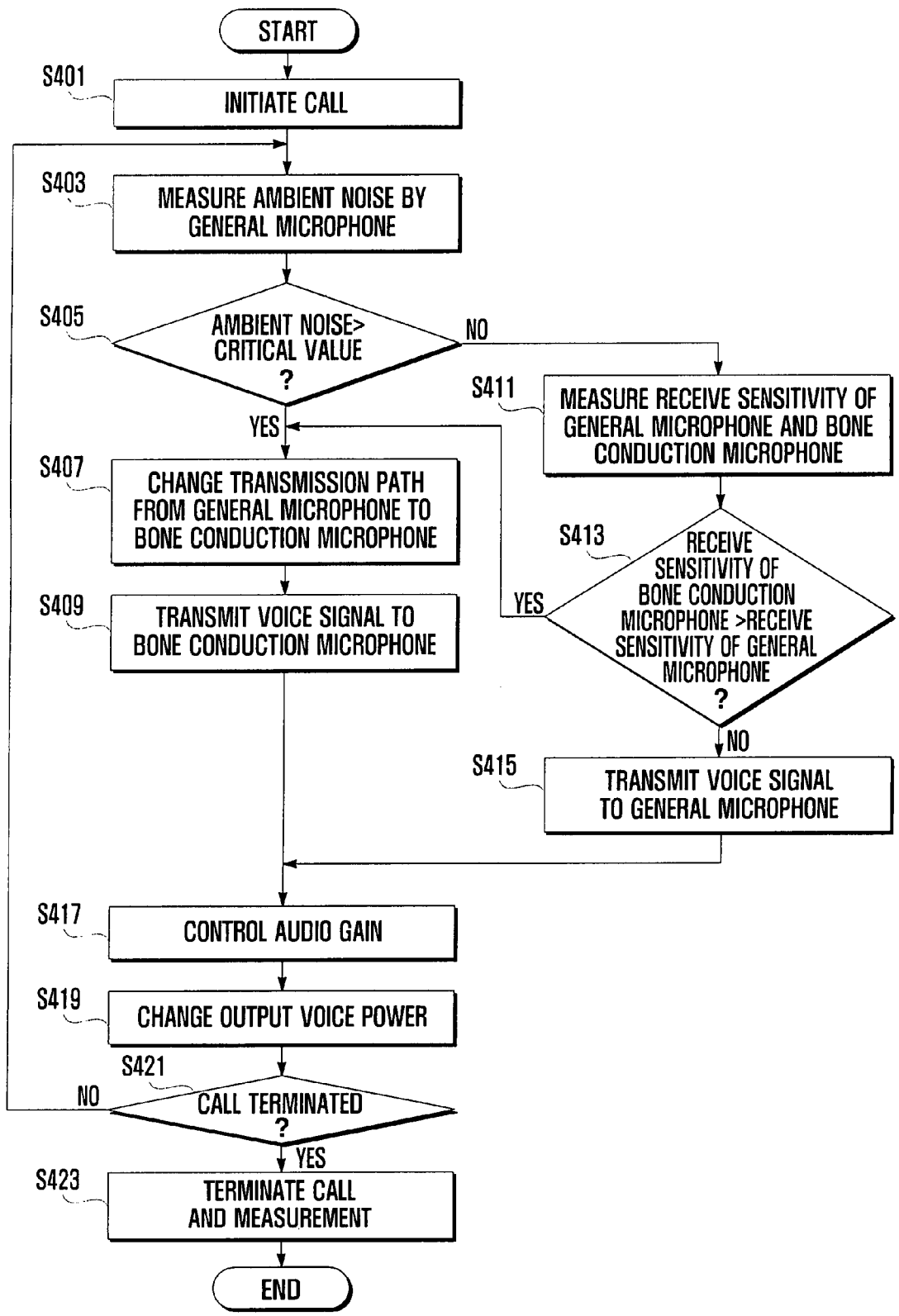
FIG. 4 is a flow chart describing a method for outputting a voice signal from a Bluetooth headset according to another embodiment of the present invention.

FIG. 4 is a flow chart describing a method for switching microphones and adjusting audio gain in a Bluetooth headset based on ambient noise, according to another embodiment of the present invention. Specifically, FIG. 4 describes a case where the Bluetooth headset is set to in a single microphone mode.

Referring to FIG. 4, when a portable terminal initiates a call with an opposite portable terminal (S401), the controller of the Bluetooth headset measures ambient noise through a general microphone (S403). The controller operates only the general microphone at the initial time according to settings. Therefore, the controller transmits a voice signal inputted through the general microphone to the portable terminal when the call is initiated, and simultaneously detects ambient noise inputted through the general microphone to measure it.

Next, the controller compares the measured ambient noise with the critical value previously set (S405). When the ambient noise is equal to or greater than the critical value (critical level), the controller switches the transmission path of the voice signal from the general microphone to a bone conduction microphone (S407). Then, the voice signal is transmitted through the bone conduction microphone (S409).

Meanwhile, when the ambient noise is less than the critical value (critical level), the controller measures respective receive sensitivities of the general microphone and bone conduction microphone (S411). Here, the controller compares the respective input signals of the general microphone and bone conduction microphone to extract a voice signal, and separates the ambient noise from the voice signal.

Next, the controller compares the measured receive sensitivities of the general microphone and bone conduction microphone (S413). When the receive sensitivity of the bone conduction microphone is equal to or greater than that of the general microphone, the procedure proceeds to step S407 where the controller switches the transmission path of the voice signal from the general microphone to the bone conduction microphone. On the other hand, when the receive sensitivity of the bone conduction microphone is less than that of the general microphone, the controller transmits the voice signal through the general microphone (S415). That is, the controller connects the transmission path of the voice signal to the general microphone, thereby transmitting only the voice signal through the general voice microphone. In that case, the controller may turn off the bone conduction microphone.

On the other hand, the controller can adjust audio gain using the measured ambient noise. That is, the controller extracts audio gain corresponding to the measured ambient noise from the mapping table where audio gains have been set (S417), and adjusts output audio gain of the output unit. After that, the controller changes output volume of the output unit according to the audio gain (S419).

Next, the controller determines whether the call is terminated (S421). When the determination of S421 is positive, the controller terminates the call, and measuring ambient noise, and switching transmission path of a voice signal (S423). On the other hand, when the determination of S421 is negative, the procedure proceeds to S403 and the described process is repeated.

The above-described methods according to the present invention can be realized in hardware or as software or computer code that can be stored in a recording medium such as a CD ROM, an RAM, a floppy disk, a hard disk, or a magneto-optical disk or downloaded over a network, so that the methods described herein can be rendered in such software using a general purpose computer, or a special processor or in programmable or dedicated hardware, such as an ASIC or FPGA. As would be understood in the art, the computer, the processor or the programmable hardware include memory components, e.g., RAM, ROM, Flash, etc. that may store or receive software or computer code that when accessed and executed by the computer, processor or hardware implement the processing methods described herein.

While the present invention has been particularly shown and described with reference to embodiments thereof, it will be understood by those of ordinary skill in the art that various changes in form and details may be made therein without departing from the spirit and scope of the present invention as defined by the following claims.

As described in the foregoing, the apparatus and method according to the present invention can separate ambient noise form a voice signal in the headset and transmit only the voice signal, which does not include the ambient noise, to the portable terminal. Therefore, the present invention can enhance call quality between portable terminals that are in the processing of wireless communication. Also, the present invention enables the headset to remove ambient noise other than a user's voice, thereby allowing the user to perform an enhanced intelligibility call in a very noisy environment.

Also, the present invention can separate a voice signal from ambient noise, inputted through the microphone of the headset, and adjust output audio gain according to the ambient noise levels. That is, the present invention can adaptively control the output volume of the headset according to changes in ambient noise during the call. Therefore, the present invention can provide the optimum calling voice even in a very noisy environment. Thus, portable terminal users can perform an intelligible call although they are in very noisy environments.

In addition, the present invention allows a bone conduction microphone to input a voice signal in a very noisy environment and a general microphone to input the voice signal in an environment with relatively little noise, thereby enhancing the intelligibility of a call, without a high quality microphone. That is, the present invention can adaptively change the transmission path of a voice signal between the general microphone and the bone conduction microphone according to the measured ambient noise level, thereby providing optimal calling voice quality to the portable terminal users.

What is claimed is:

1. A method for providing an output voice signal in a headset comprising:
   receiving, by a first microphone of the headset, a user's voice signal and noise signal to provide a first input signal;
   converting, by a second microphone of the headset, a vibration signal generated according to a user's voice event to an electrical signal as a second input signal;
   obtaining an extracted voice signal and noise signal from the first and second input signals, wherein the extracted voice signal is provided as the output voice signal;
   determining an ambient noise level based on the noise signal; and
   providing the output voice signal using the first microphone if the ambient noise level is below a predetermined threshold and providing the output voice signal using the second microphone if the noise level is above the threshold.

2. The method of claim 1, further comprising the steps of:
   comparing similar patterns in the first and second input signals:
   detecting a signal having a substantially similar pattern based on the comparison;
   processing the detected signal having a substantially similar pattern to a voice signal; and
   outputting the processed signal to a portable terminal that is communicating with the headset.

3. The method of claim 2, further comprising the steps of:
   separating a signal whose intensity is different from that of the extracted voice signal from the first and. second input signals: and
   controlling output audio gain based on level of the separated signal.

4. The method of claim 2, wherein the pattern comparison is performed based on one or more of frequency, amplitude and phase of the signal.

5. The method of claim 3, wherein the controlling output audio gain comprises the steps of:
   determining audio gain according to the signal levels in a mapping table where audio gains have been set based on ambient noise levels; and
   controlling the output audio gain based on the determined audio gain.

6. A headset providing an output voice signal, comprising:
   a first microphone for inputting a user's voice signal and noise signal to provide a first input signal;
   a second microphone for converting a vibration signal generated according to a user's voice event to an electrical signal as a second input signal; and
   a controller which controls operations such that in a dual microphone mode of the headset, an extracted voice signal and noise signal are obtained from the first and second input signals, the extracted voice signal being provided as the output voice signal, and,
   in a single microphone mode of the headset, the controller determines an ambient noise level based on the noise signal and in accordance therewith, controls a transmission path for a voice signal between the first and second microphones such that only the first microphone is used to provide the output voice signal if the ambient noise level is below a predetermined threshold and only the second microphone is used to provide the output voice signal if the noise level is above the threshold.

7. The headset of claim 6, wherein in the dual microphone mode, the controller compares the first input signal associated with the first microphone with the second input signal associated with the second microphone, and extracts the voice signal of substantially identical intensity from the first and second input signals and the noise signal whose intensity is different from that of the voice signal, based on the comparison result.

8. The headset of claim 7, wherein in the dual microphone mode, the controller detects a signal having substantially similar patterns in the first and second input signals, and extracts the voice signal from the signal having the similar patterns.

9. The headset of claim 8, wherein in the dual microphone mode, the controller compares one or more of frequency, amplitude, and phase of the first and second input signals to determine whether the first and second input signals have the similar patterns.

10. The headset of claim 7, wherein the controller adaptively controls output audio gain of the headset based on the noise signal.

11. The headset of claim 10, wherein the controller extracts audio gain corresponding to the noise signal based on a mapping table where audio gains have been set based on noise signal levels, and controls output audio gain of the headset using the extracted audio gain.

12. The headset of claim 6, wherein a user setting controls whether the headset is in the dual microphone mode or the single microphone mode.

13. The headset of claim 12, wherein the first microphone further comprises a sensor to measure noise signal.

14. The headset of claim 6, wherein the controller comprises:
   a microphone mode controlling unit for controlling the transmission path of the voice signal between the first and second microphones;
   a noise detector for periodically detecting, in the dual microphone mode, noise signals through the first microphone;
   an input signal comparing unit for comparing the first input signal of the first microphone with the second input signal of the second microphone;
   an output signal generating unit for detecting a voice signal of identical intensity from the first and second input signals based on the comparison result, and separating the noise signal whose intensity is different from that of the voice signal from the voice signal.

15. The headset of claim 14, wherein the input signal comparing unit further compares the first input signal with the second input signal that is not mixed with the noise signals.

16. The headset of claim 14, wherein the input signal comparing unit compares one of more patterns of frequency, amplitude, and phase of the first and second input signals based on a digital signal processing result.

17. The headset of claim 14, wherein the output signal generating unit detects a signal of one or more similar patterns of similar frequency, amplitude, and phase within a preset error, based on the comparison result of the first and second input signals, processes the detected signal to a voice signal, and processes signals whose intensity is different from that of the voice signal to noise signal.

18. The headset of claim 14, wherein the noise detecting unit detects the noise signal from a value measured by a sensor that detects noise of the first microphone.

19. The headset of claim 14, wherein the controller further comprises an output gain adjusting unit that detects audio gain of the detected noise signal based on a mapping table where audio gains have been set based on noise signal levels, and adjusts output audio gain of the headset using the detected audio gain.

20. The headset of claim 7, wherein the second microphone comprises a bone conduction microphone.

21. The headset of claim 20, wherein the bone conduction microphone detects vibration of a user's voice to convert it to a voice signal.

22. The headset of claim 7, further comprising a switching unit for controlling, in the single microphone mode, a path connected to the first and second microphones according to path set control of the first and second microphones.

23. The headset of claim 7, further comprising a wireless communication unit that performs Bluetooth communication with other Bluetooth devices, through an antenna, based on a Bluetooth protocol.

24. The headset of claim 23, wherein the wireless communication unit further comprises an output unit that converts a voice signal received from a portable terminal into audible sound and outputs it.

25. The headset of claim 24, wherein the output unit comprises a bone conduction speaker.

26. The headset of claim 7, further comprising an input unit generating a control signal to control operations of the headset.

* * * * *

UNITED STATES PATENT AND TRADEMARK OFFICE
CERTIFICATE OF CORRECTION

| | | Page 1 of 1 |
|---|---|---|
| PATENT NO. | : 8,792,648 B2 | |
| APPLICATION NO. | : 11/900015 | |
| DATED | : July 29, 2014 | |
| INVENTOR(S) | : Hee Young Kim et al. | |

It is certified that error appears in the above-identified patent and that said Letters Patent is hereby corrected as shown below:

In the Claims

Column 13, Claim 2, Lines 25-26 should read as follows:
--...signals; detecting a signal...--

Column 13, Claim 3, Line 34 should read as follows:
--...first and second input...--

Column 13, Claim 3, Lines 35-36 should read as follows:
--...signals; and controlling output...--

Column 14, Claim 16, Line 52 should read as follows:
--...one or more patterns...--

Signed and Sealed this
Twenty-fifth Day of November, 2014

Michelle K. Lee
*Deputy Director of the United States Patent and Trademark Office*